United States Patent
Muramatsu

Patent Number: 5,222,111
Date of Patent: Jun. 22, 1993

[54] PULSE GENERATOR CIRCUIT EMPLOYING ARITHMETIC FUNCTION COUNTER

[75] Inventor: Kikuo Muramatsu, Itami, Japan

[73] Assignee: Mitsubishi Denki Kabushiki Kaisha, Tokyo, Japan

[21] Appl. No.: 780,731

[22] Filed: Oct. 16, 1991

[30] Foreign Application Priority Data

Oct. 29, 1990 [JP] Japan ............................. 2-292768

[51] Int. Cl.⁵ .................... H03K 3/02; H03K 21/38
[52] U.S. Cl. ............................... 377/49; 377/51; 377/54; 328/60; 307/265
[58] Field of Search ............. 377/51, 54, 49; 328/60; 307/265

[56] References Cited

U.S. PATENT DOCUMENTS

| | | | |
|---|---|---|---|
| 4,031,376 | 6/1977 | Corkin | 377/51 |
| 4,633,183 | 12/1986 | Heatherington | 377/51 |
| 4,805,199 | 2/1989 | Muramatsu | 377/39 |
| 4,837,791 | 6/1989 | Nakanishi et al. | 377/49 |
| 4,965,817 | 10/1990 | Angele | 377/54 |
| 4,969,164 | 11/1990 | Mehta et al. | 377/49 |

Primary Examiner—John S. Heyman
Attorney, Agent, or Firm—Morrison Law Firm

[57] ABSTRACT

A pulse generator circuit includes an adder, a count register which holds the result of addition provided by the adder in order for the addition-result for recursive addition in the adder, a constant register holding a constant required for making said adder continue to perform count-up/count-down operation until a carry/borrow occurs, a parameter register for applying to said adder a correction value for changing, during a normal count-up/count-down operation, the time when carry/borrow occurs, a selector for selecting one of said constant and parameter registers for applying the value held in the selected register to said adder, and a shift register responsive to a carry/borrow occuring in the addition-result from said adder for shifting the content thereof.

13 Claims, 6 Drawing Sheets

PULSE GENERATOR CIRCUIT EMPLOYING ARITHMETIC FUNCTION COUNTER

This invention relates to a pulse generator circuit, and more particularly to such a circuit for use with a microcomputer system for generating a pulse signal to control an actuator.

BACKGROUND OF THE INVENTION

As is well known, a pulse signal is a signal which comprises alternating high and low level portions, and is widely used as a signal for controlling various actuators. More specifically, a pulse signal may be used for, for example, controlling automobile engine fuel injection, engine ignition timing, a motor chopper, etc.

FIG. 1 is a block diagram of an example of a prior art pulse generator circuit which was invented by the inventor and is disclosed in Japanese Published Patent Application No. HEI 1-73812 (corresponding to U.S. Pat. No. 4,805,199). This pulse generator circuit is incorporated in a one-chip microcomputer which is primarily to execute real-time processing.

Referring to FIG. 1, a CPU 1 of a microcomputer is connected through a data bus 2 to a prescaler 9, a counter buffer 15, an output level storage circuit 10, a counter 12, and other circuits for transferring various data signals therebetween.

A count start value is set in the counter 12 as a reload value. When the count of the counter 12 underflows, the counter 12 produces an underflow signal. The underflow signal is applied as a control signal to a gate 14 through a line 13a, and is also applied through a line 13b to the output level storage circuit 10 as a clock pulse therefor. The underflow signal is also applied to the CPU 1.

The counter 12 is coupled via the gate 14 to the counter buffer 15. When the gate 14 is enabled in response to the underflow signal applied thereto through the line 13a, a value stored in the counter buffer 15 is set in the counter 12 as a reload value.

A clock signal generator circuit 8 generates a clock signal (internal clock) with which the microcomputer system operation is referenced. The clock signal is applied to the prescaler 9.

The prescaler 9 is a frequency divider circuit, which frequency-divides a reference clock signal applied to it from the clock signal generator circuit 8 to produce a count clock signal of a frequency required by the counter 12. This count clock signal is applied via a count-enable switch 16 to the counter 12.

The output level storage circuit 10 shown in FIG. 1 comprises a looped four-stage shift register arrangement including four stages Q0 through Q3. Data, i.e. "1" or "0", corresponding to levels in a pulse signal to be developed from the microcomputer system, has been pre-set in the respective stages of the output level storage circuit 10 by the CPU 1. The value stored in the stage Q3 of the output level storage circuit 10 is applied to an output terminal 11 of the microcomputer system, and each time the underflow signal is applied from the counter 12 to the output level storage circuit 10, the contents of the respective stages Q0-Q3 are shifted rightward in a circulating manner so that the respective contents of the stages are successively provided from the stage Q3 to the output terminal 11.

Now, the operation of the above-described prior art pulse generator circuit is described with reference to a timing chart shown in FIGS. 2(a)-2(c).

Let it be assumed that "0", "1", "0", and "0" are initially set in the shift register stages Q0, Q2, Q3, and Q4, respectively, of the output level storage circuit 10 and that the value "0" held in the stage Q3 is developed as an output at the output terminal 11. Since the output appearing at the output terminal 11 is the value "0" held in the stage Q3, the level of the output pulse signal is low as shown in FIG. 2(a).

Let it be assumed again that under this condition, as shown in FIG. 2(b), the CPU 1 sets a count start value N1, as an initial value, in the counter 12 and a reload value N2 in the counter buffer 15, respectively, through the data bus 2 at a time T21.

At a time T22, count-enable switch 16 is closed, and the content of the stage Q2 of the output level storage circuit 10 is shifted to the register stage Q3 from Q2 in response to a count clock pulse applied thereto from the prescaler 9. Since the value now shifted to the stage Q3 from the stage Q2 is also "0", the output pulse from the output terminal 11 remains at the low level as shown in FIG. 2(a). At the same time, the counter 12 starts counting the clock pulses provided by the prescaler 9. More specifically, the counter 12 decrements one count for each clock pulse from the count start value N1 held in the counter 12, and, TN1 after, at a time T23, underflow occurs and an underflow signal is developed. The time period TN1 corresponds to the count N1 in the counter 12. The underflow signal is applied to the output level storage circuit 10, so that the shifting operation takes place in the circuit 10 and the value in the output stage Q3 is now the value "1" originally set in the stage Q1, which now developed at the output terminal 11. Thus, the level of the output pulse signal changes to a high level as shown in FIG. 2(a).

At the same time, the underflow signal is also applied via the line 13a to enable the gate 14 so that a new reload value N2 is loaded into the counter 12 from the counter buffer 15. Then, the counter 12 resumes counting from the new count start value N2.

At a time T24, TN2 after the T23, where TN2 corresponds to the count N2 in the counter 12, the counter 12 underflows again, so that, as in the previous case, the value in the output stage Q3 of the output level storage circuit 10 changes from "1" originally set in the stage Q1 to "0" which was originally set in the stage Q0. Thus, the value "0" is now developed at the output terminal 11. Thus, the output pulse signal changes to the low level.

Thus, a pulse signal, as shown in FIG. 2(a), having a pulse width (T23-T24) corresponding to the initial count preset in the counter 12 is generated.

The above-described conventional pulse generator circuit with the described arrangement and operation has problems, which are now discussed hereinafter.

For example, in air/fuel ratio control, which is one of automobile engine fuel injection controlling techniques, it is necessary to supply fuel to a combustion chamber of an engine in an amount matching the amount of air taken into the chamber during one intake stroke. In such air/fuel ratio control, the amount of fuel supplied is determined by the time when a fuel injector is turned on. For such engine air/fuel ratio control, a micro-computer system including a pulse generator circuit such as one stated above is frequently used to provide a pulse signal necessary for controlling the amount of fuel to be supplied.

When an automobile is running, the intake amount of air and the engine rotation speed vary from time to time depending on the operating state of an accelerator, road conditions, etc., and, therefore, it is desirable to adjust the amount of fuel to be injected even after the fuel injection based on the data corresponding to the intake amount of air, the engine rotation speed, the state of the accelerator, etc. measured just prior to the fuel injection is started.

A timing chart for use in explaining the adjustment of the amount of injected fuel by means of the conventional pulse generator circuit is shown in FIGS. 3(a)-3(d).

A crank angle sensor signal shown in FIG. 3(a) is a signal indicative of an engine crank angle. One period of the crank angle sensor signal corresponds to one rotation cycle of the engine. Thus, the engine rotation speed can be known by counting the number of periods of the crank angle sensor signal. This signal is used also as a reference signal for measuring the intake amount of air and also for determining the time when fuel is to be injected.

When the crank angle sensor signal is provided, the engine rotation speed, the intake amount of air taken into the combustion chamber, etc. are immediately measured in order to determine the amount of fuel to be injected.

FIGS. 3(a) to 3(d) is now explained with an assumption that, as in FIGS. 1 and 2(a)-2(c), "0", "1", "0", "0" are originally set in the register stages Q0, Q1, Q2, and Q3, respectively, which is shown in FIG. 3(d).

At a time T31, a value N1 providing an optimum fuel injection starting timing is set in the counter 12 of the pulse generator circuit, as shown in FIG. 3(c), and an initial value N2 providing a pulse width TN2 corresponding to the determined amount of fuel to be injected is set in the counter buffer 15. Then, the count-enable switch 16 is closed at a time T32.

After the closure of the count-enable switch 16 at the time T32, the first count-down operation is started from the initial count value N1, and underflow occurs at a time T33. During the first count-down operation, the level of the output pulse signal at the output terminal 11 is low, as shown in FIG. 3(b), and, therefore, fuel is not injected.

Then, at the time T33, the second count-down cycle starts from the initial count N2 which corresponds to a time interval during which fuel is injected. During the second count-down operation, the level of the output pulse signal at the output terminal 11 is high, and fuel is injected or supplied to the engine. Now, let it be assumed that at a time T34 which is before the time T36 at which the second count-down operation or fuel injection would end, the engine rotation speed changes or the amount of stepping on the accelerator pedal changes. When such a change occurs, the count in the counter 12 must be corrected by $\alpha$ in order to change the amount of fuel to be injected. For this correction, the CPU 1 must read out the count n in the counter 12 at the time T34 during the second count-down cycle, add the value $\alpha$ to the read out count n, and write in the counter 12 the value $n+\alpha$ minus a count $\beta$ which corresponds to a processing time TS (hereinafter referred to as software processing time) necessary for making the correction in accordance with a program (software). The writing of the new count into the counter 12 is carried out at a time T35 which is the time TS after the time T34. As a result, the time period during which fuel is injected or, in other words, during which the output pulse signal of the pulse generator circuit is maintained at the high level is extended from the initially set time period TN2, corresponding to the count N2, by a time period T$\alpha$ corresponding to the added count value $\alpha$ in the counter 12.

Thus, in the conventional system, various restrictions are added when software is prepared. For example, the software processing time TS must be constant, any interruptions must be inhibited during a time period when correction is being carried out, etc. Furthermore, the conventional system involves restrictions on control. For example, because the entire processing is delayed by the time TS necessary for software processing, the correction is possible only before the time point T37 which, in turn, is earlier by TS than the termination of the fuel injection.

The object of the present invention is to eliminate various restrictions such as the ones stated above, by providing a pulse generator circuit in which correction of a pulse width while a pulse signal is being generated is not affected by a delay which would be caused due to software processing and, therefore, the pulse width can be changes as desired at any desired time.

SUMMARY OF THE INVENTION

According to the present invention, a pulse generator circuit includes an adder, a count register for holding results of the addition provided by said adder for recursive addition, constant registers for holding constants for causing the adder to perform count-up/count-down operation until carry/borrow occurs in the adder, a parameter register for applying to the adder a correction value for changing a time when carry/borrow is to occur during a normal count-up/count-down operation, and a shift register through which values held in respective stages thereof are shifted one stage each time carry/borrow occurs in the result of addition of the adder. Values corresponding to levels in an output pulse signal are held in the respective shift register stages.

In the pulse generator circuit of the present invention, a value held in one of the constant registers and a content of the count register are summed in the adder so as to perform a normal count-up/count-down operation until carry/borrow occurs, and, when it becomes necessary, a content of the parameter register may be applied to the adder during the count-up/count-down operation so that the time when carry/borrow is to occur is changed. Thus, the time at which the values held in the respective stages of the shift register are developed as levels of the output pulse signal is modified so as to change the pulse width of the output pulse signal.

DESCRIPTION OF EMBODIMENT OF THE INVENTION

Figure 1:
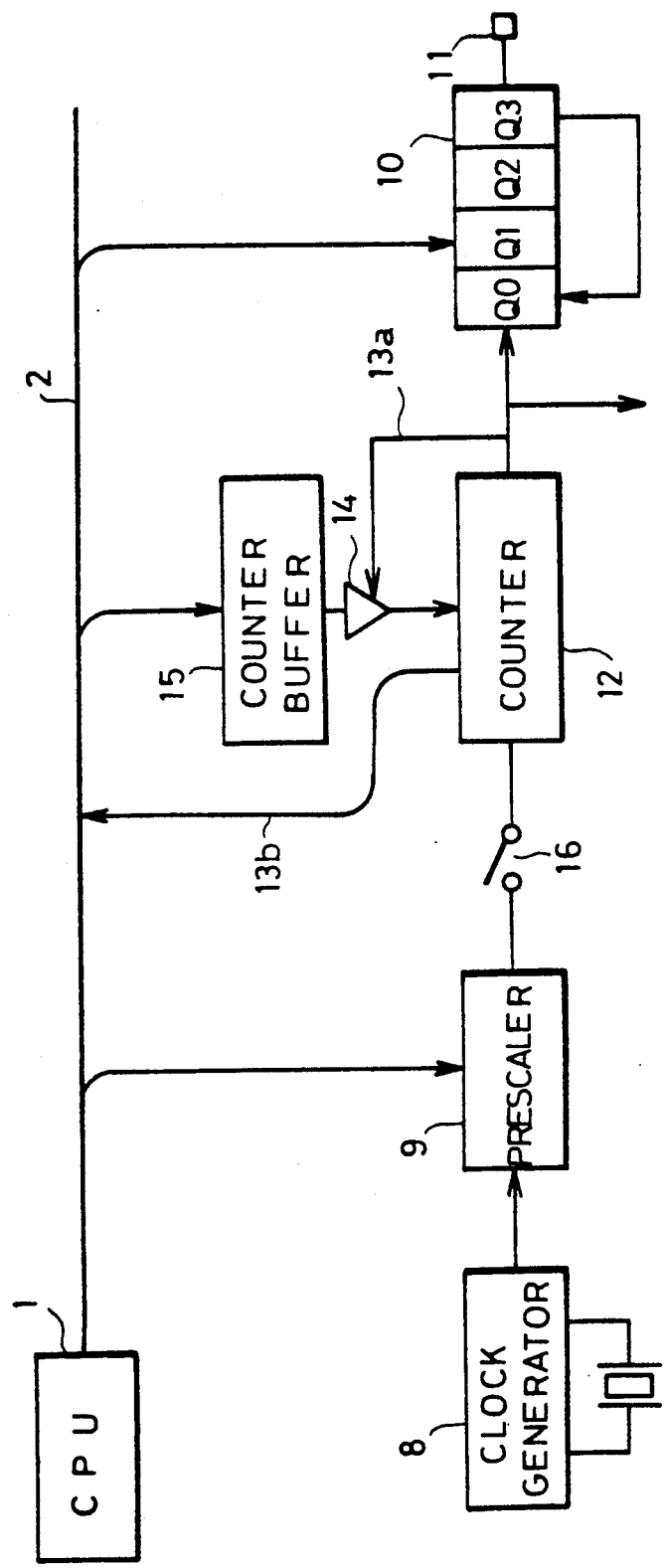
FIG. 1 is a block diagram of a conventional pulse generator circuit.
Figure 2:
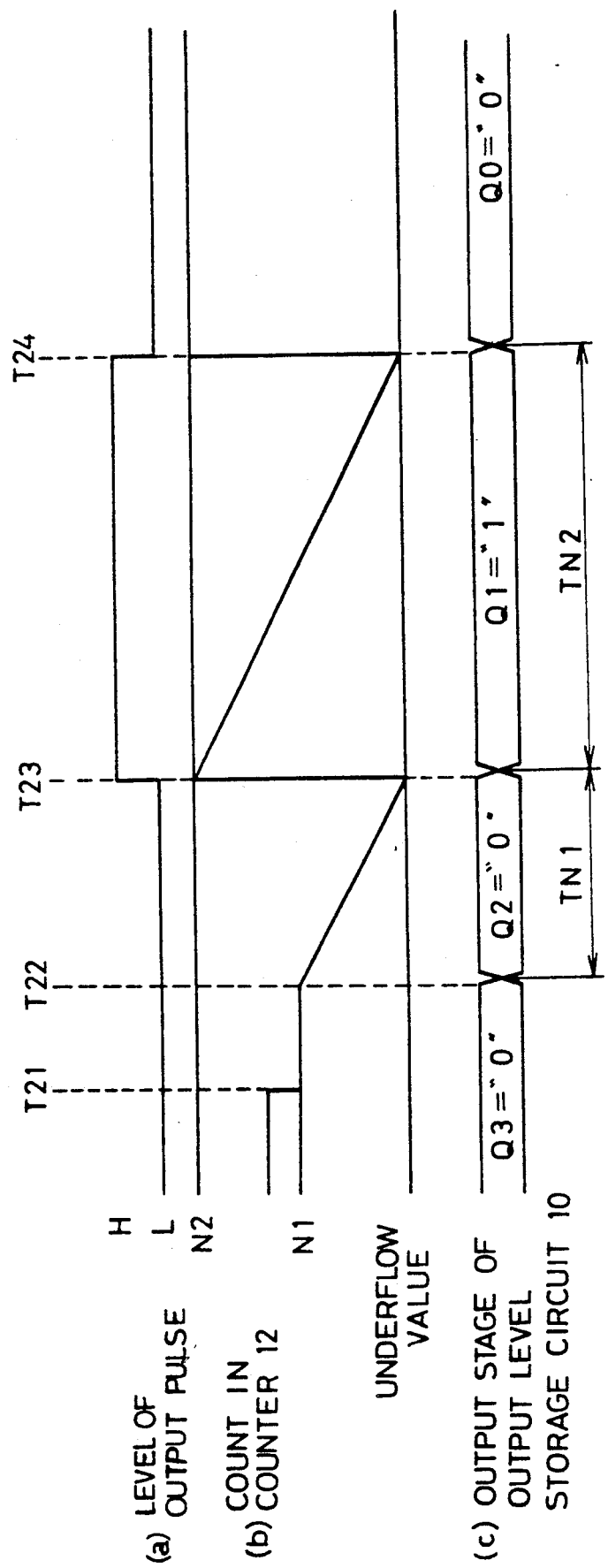
FIGS. 2(a)-2(c) are timing charts for use in explaining the operation of the conventional pulse generator circuit shown in FIG. 1.
Figure 3:
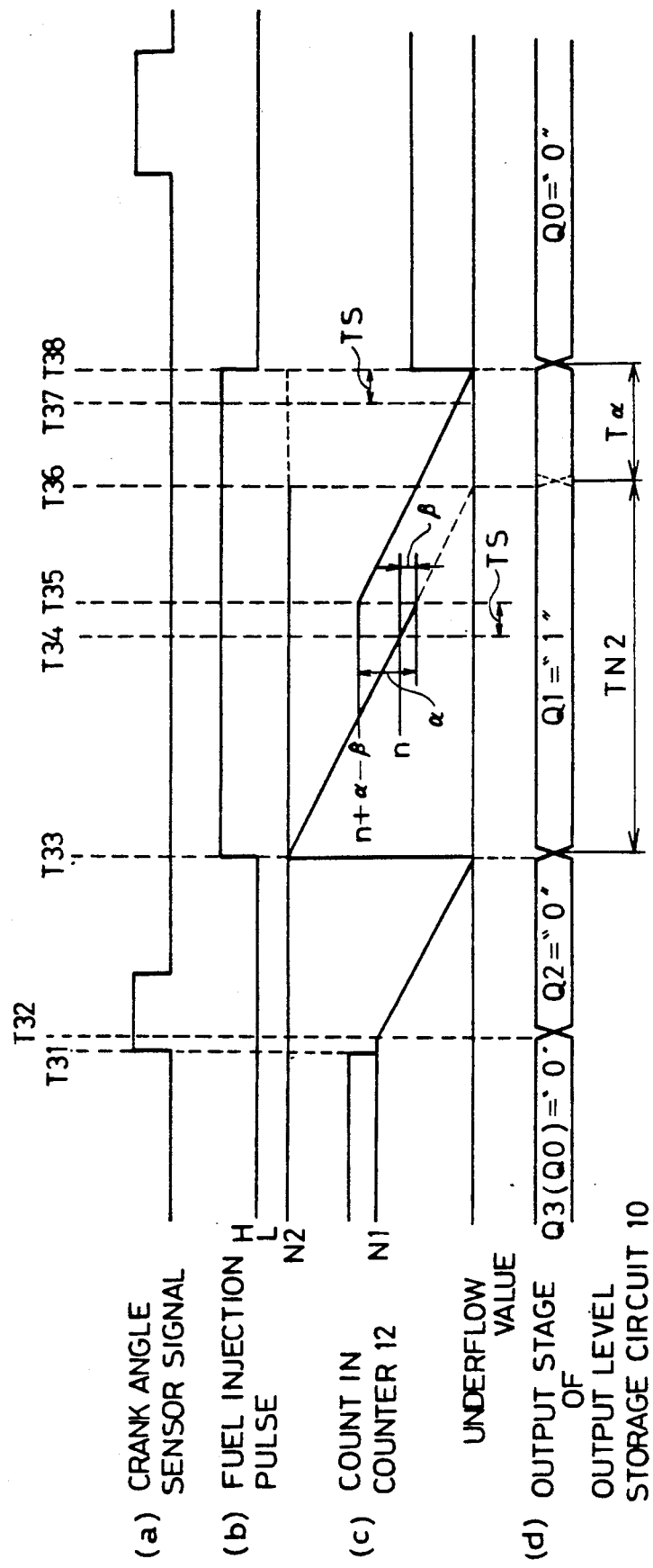
FIGS. 3(a)-3(d) are timing charts for use in explaining the conventional pulse generator circuit used for controlling the amount of fuel to be injected into an automobile engine.

Now, the present invention is described by means of an embodiment shown in the drawings.

Figure 4:
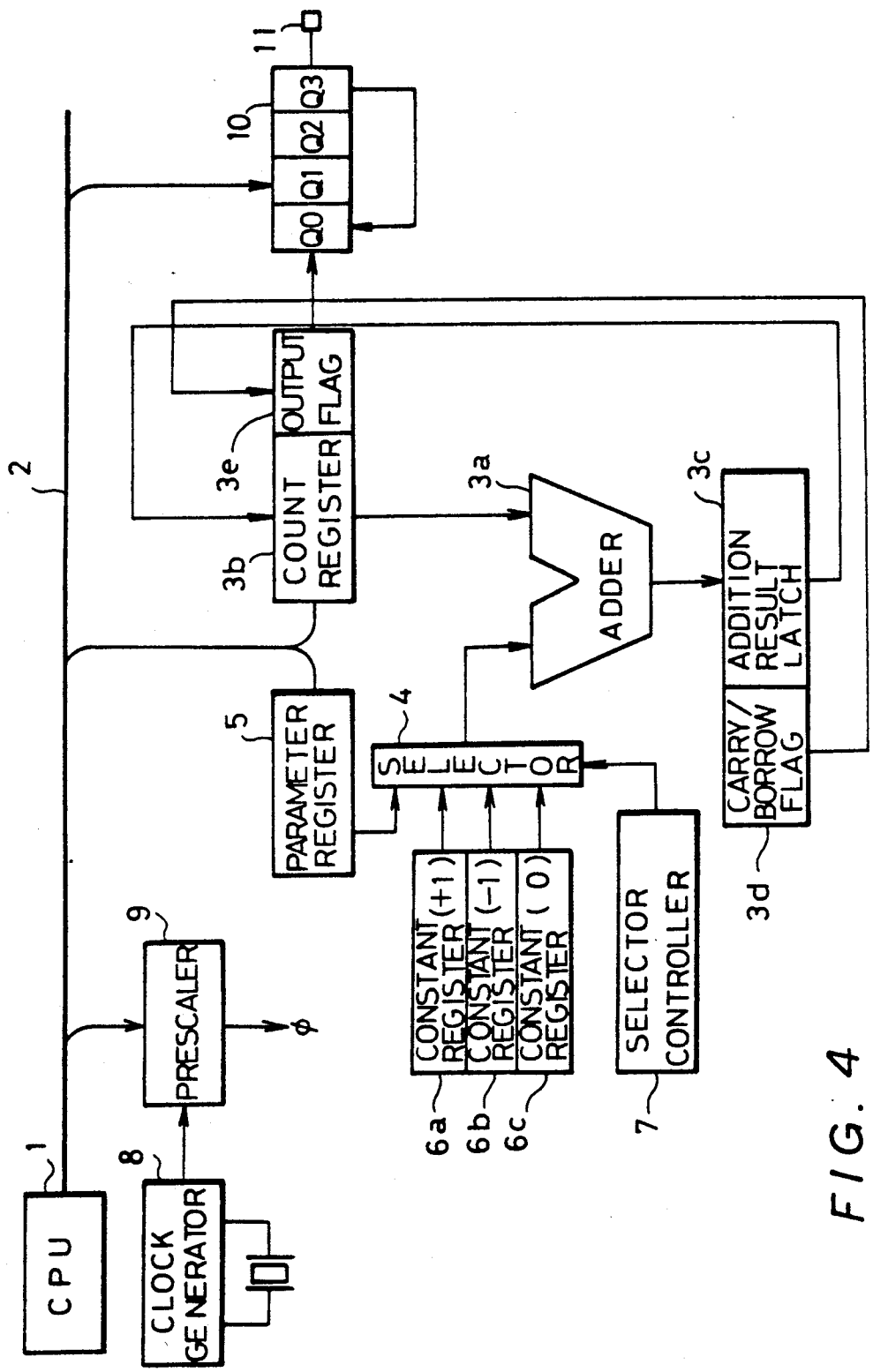
FIG. 4 is a block diagram of a pulse generator circuit according to one embodiment of the present invention.

FIG. 4 is a block diagram of a pulse generator circuit according to one embodiment of the present invention. In this embodiment, the pulse generator circuit is incorporated in a one-chip microcomputer. The same reference numerals and symbols are used for components and functions in the arrangement of FIG. 4 which are similar to those shown in FIG. 1.

In FIG. 4, a microcomputer CPU 1 is connected via a data bus 2 to a prescaler 9, a parameter register 5, a count register 3b, an output level storage circuit 10, and so forth, and data signals are transferred between the CPU 1 and them.

The output of the count register 3b is connected to one input of an adder 3a, to the other input of which the output of a selector 4 is connected.

In addition to the above-stated parameter register 5, first, second and third constant registers 6a, 6b, and 6c are connected to the input of the selector 4. The constant registers 6a, 6b and 6c hold $+1$, $-1$ and 0. respectively. Thus, the selector 4 selects the parameter register 5 or one of the constant registers 6a, 6b and 6c and connects the selected register to the adder 3a.

The output of the adder 3a is connected to an addition-result latch 3c. An output of the addition-result latch 3c is applied as an input to the count register 3b. A carry/borrow flag 3b is additionally provided in the addition-result latch 3c in order to detect overflow-/underflow in the result of addition in the adder 3a. An output from the carry/borrow flag 3d is applied to an output flag 3e associated with the count register 3b.

The selection of one of the parameter register 5 and the constant register 6a, 6b and 6c by the selector 4 is such that when data is written in the parameter register 5 or when the carry/borrow flag 3d is set, a signal is sent from a selector controller 7 to the selector 4 to switch from one of the constant registers 6a, 6b and 6c to the parameter register 5. The selector 4 selects the constant register holding "+1" for count-up operation, the constant register 6b holding "−1" for count-down operation, and the constant register 6c holding "0" for interrupting the counting operations. The selecting operation by the selector 4 is controlled through the selector controller 7 by the CPU 1 depending on what processing should be performed at particular times.

A clock generator circuit 8 generates a clock signal (internal clock signal) to which the operation of the microcomputer system is referenced. The pulse generator circuit of the present invention is incorporated in this microcomputer system. The internal clock signal generated by the clock generator circuit 8 is applied to the prescaler 9.

The prescaler 9 comprises a frequency divider circuit which appropriately frequency-divides the reference clock signal applied thereto from the clock generator circuit 8 to produce a clock signal $\phi$ for counting use (hereinafter referred to count clock signal) which is applied to various portions of the pulse generator circuit of the present invention. For example, the addition operation of the adder 3a is performed in synchronization with this count clock signal $\phi$.

In the illustrated embodiment, the output level storage circuit 10 comprises four shift register stages Q0, Q1, Q2 and Q3 which are connected to form a loop. The CPU 1 causes data, i.e. "1" or "0", corresponding to the levels in a pulse signal to be provided as an output pulse signal of the pulse generator circuit, to be stored in the respective stages of the output level storage circuit 10. The values in the four stages of the output level storage circuit 10 are successively developed at an output terminal 11. The output from the output flag 3e is applied as a clock input to the output level storage circuit 10, and each time the output flag 3e is set, the contents of the respective stages Q0, Q1, Q2 and Q3 of the output level storage circuit 10 are shifted one stage rightward, with the content in the stage Q3 shifted to the stage Q0 in a circulating manner so that the content shifted to the stage Q3 is developed at the output terminal 11.

Now, the operation of the pulse generator circuit with the above-described arrangement is described with reference to a timing chart shown in FIGS. 5(a)-5(i).

The timing chart shown in FIGS. 5(a)-5(i) are for an arrangement in which the adder 3a performs a count-up operation and, when the count reaches a predetermined value, an overflow signal is generated to cause the contents of the stages in the output level storage circuit 10 to shift by one stage.

It is assumed that at a time T51, a count start value N1 has been set, as an initial value, in the count register 3b by the CPU 1, as shown in FIG. 5(g). If the selector 4 selects the parameter register 5 at the time when the count start value N1 is set in the parameter register 5 by the CPU 1, as shown in FIG. 5(d) and then selects the constant register 6c holding the constant "0", the adder 3a repeatedly performs the arithmetic operation of "N1+0", as shown in FIG. 5(e). Accordingly, the content of the addition-result latch 3c does not change, as shown in FIG. 5(f), and the content of the count register 3b is maintained at the count start value N1.

When the selector 4 selects the constant register 6a which holds "+1" at a time T52, the adder 3a performs the addition of the value held in the count register 3b and the value held in the constant register 6a, in synchronization with the count clock signal $\phi$ shown in FIG. 5(a). That is, the adder 3a performs calculation of "N1+1", so that the content of the addition-result latch 3c is incremented by "+1" and the content of the count register 3b is also incremented by "+1". After that, the content of the count register 3b is successively incremented by "+1" in synchronization with the count clock signal $\phi$.

The incrementing or count-up operation of the adder 3a continues until the result of addition performed by the adder 3a overflows at a time T56 and a high level signal is applied from the output flag 3e to the output level storage circuit 10, as shown in FIG. 5(h). This causes a shift in the output level storage circuit 10, so that the output of the circuit 10 changes to the output of a different stage than previous one, as shown in FIG. 5(i).

Now, a situation that a pulse width is requested to be changed while a pulse is being formed is considered.

A correction value $\alpha$ is written in the parameter register 5 by the CPU 1 at, for example, a time T53 as shown in FIG. 5(b). Then, the selector 4 selects the parameter register 5 at a time T54 determined by a clock pulse φ occurring immediately after the time T53, as shown in FIG. 5(c), whereby the current content n of the count register 3b and the correction value α are added on the adder 3a, and the result "n+α" is sent via the addition-result latch 3c to the count register 3b and stored there at a time T55.

Thereafter, the selector 4 is switched to select the constant register 6a which holds "+1", whereby the ordinary incrementing operation which was performed before the time T53 is resumed in the adder 3a. As the incrementing operation of the adder 3a continues, overflow will occur in the result of addition from the adder 3a at the time T56, as described previously, to thereby set the carry/borrow flag 3d, which, in turn, sets the output flag 3e. This set output from the output flag 3e corresponds to an overflow flag in conventional arrangements, and, therefore, when it is applied to the output level storage circuit 10, it acts as a shifting clock signal which causes shifting operation in the output level storage circuit 10, as described previously.

The present embodiment is arranged such that when the register selected by the selector 4 is switched from the constant register 6c holding "0" to the constant register 6b holding "+1", too, shift occurs in the output level storage 10.

Now, the operation of the pulse generator circuit of the present invention used in an actuator the width of an output pulse of which needs to be modified from time to time is described with reference to the timing chart shown in FIGS. 6(a)-6(d). The actuator may be for controlling injection of fuel into an automobile engine.

In the pulse generator circuit to be described hereinafter with reference to the timing chart shown in FIGS. 6(a)-6(d), the adder 3a performs count-down operation and, when underflow occurs, a shifting operation takes place in the output level storage circuit 10.

Figure 6:
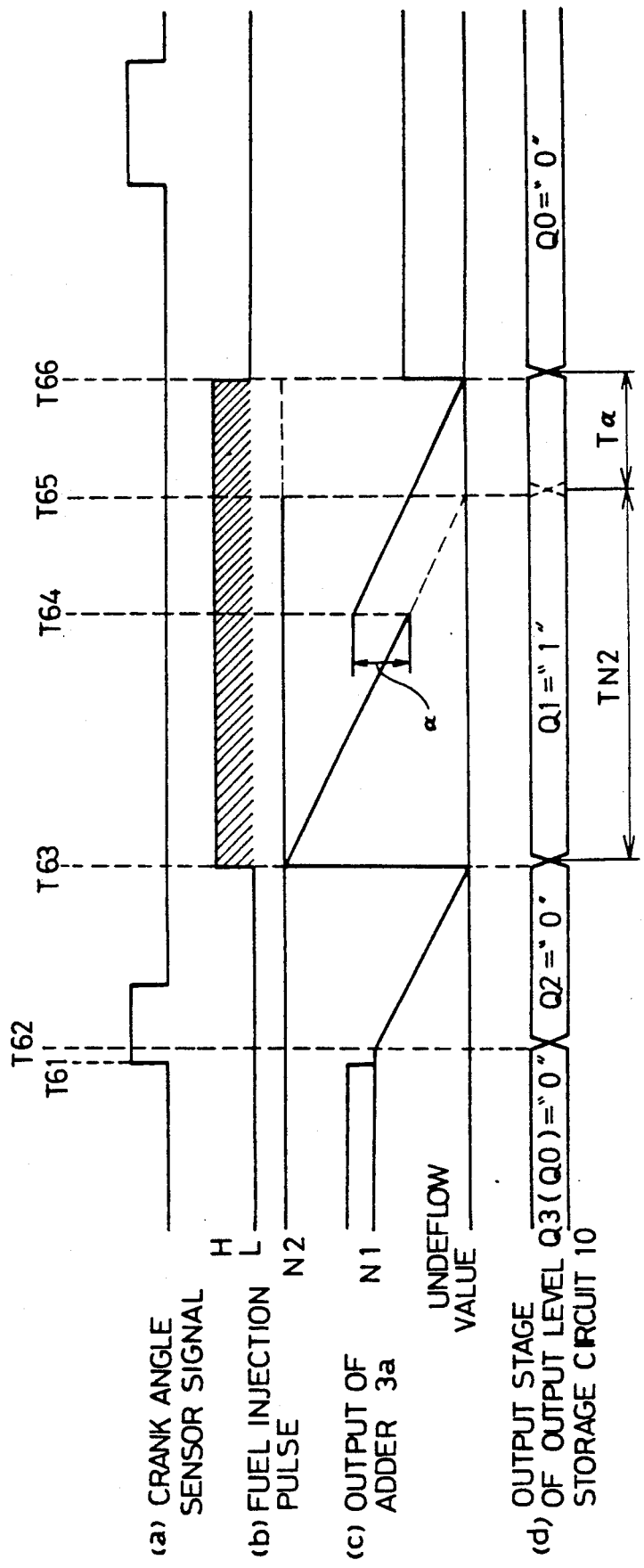
FIGS. 6(a)-6(d) are timing charts for use in explaining the operation of the pulse generator circuit of the present invention used for controlling the amount of fuel to be injected into an automobile engine.

A crank angle sensor signal shown in FIG. 6(a) represents an engine crank angle, and its one period corresponds to one engine rotation. Thus, the engine rotation speed can be measured by counting the periods of the crank angle sensor signal. This signal also serves as a reference signal for measuring the amount of air taken into the engine. This crank angle sensor signal further provides a reference point for determining the timing of fuel injection.

Thus, immediately after the crank angle sensor signal is applied as an input, the engine rotation speed, the intake of air, etc. are measured to determine the amount of fuel to be injected.

Now, let it be assumed that the respective register stages Q0-Q3 of the output level storage circuit 10 are initially holding "0", "1", "0" and "0". Thus, the content "0" of the stage Q3 is initially provided to the output terminal 11 as an output of the output level storage circuit 10, so that the level of the output pulse signal or fuel injection pulse is low as shown in FIG. 6(b).

At a time T61, when the selector 4 selects the constant register 6c holding "0", a value N1 providing an optimum fuel injection starting timing is set in the count register 3b, and a pulse duration N2 for the determined amount of fuel to be injected is set in the parameter register 5.

At a time T62 at which the input of the crank angle sensor signal is detected, the selector 4 is switched, by the selector controller 7, to select the constant register 6b which is holding "−1". This causes a shift in the output level storage circuit 10 so that the value initially set in the stage Q2 is now developed as an output at the output terminal 11, as shown in FIG. 6(d). Since the value initially set in the stage Q2 is "0" in the illustrated embodiment, the level of the output pulse signal remains low.

Thereafter, the count N1 is counted down and, at a time T63, underflow occurs, which causes a shift to occur in the output level storage circuit 10. Then, the value initially set in the register stage Q1 is developed at the output terminal 11 as an output of the circuit 10. Since the value initially set in the stage Q1 in the illustrated example is "1", the level of the output pulse signal changes to a high level.

Simultaneously with the occurrence of underflow, the selector 4 is switched to select the parameter register 5, which causes the calculation of "N2+0" to be performed in the adder 3a. As a result, the value N2 is held in the count register 3b. After that, the selector 4 selects the constant register 6b holding "−1" to connect it to the adder 3a so that the adder 3a starts count-down operation from the count N2.

Now, assume that at a time T64, it becomes necessary to change the pulse width due to, for example, abrupt change in the intake of air or the engine rotation speed. The CPU 1 writes a correction value α in the parameter register 5, which causes the selector controller 7 to switch the selector 4 to connect the parameter register 5 to the adder 3a. Then, the correction value α is added to the content of the count register 3b. After that, the count-down operation is resumed and continued so that the pulse width, TN2, which corresponds to the originally set count N2, is extended by a time width of, Tα which corresponds to the count α. In other words, the termination of the pulse is delayed from a time T65 by Tα, and, accordingly, the pulse ends at a time T66.

Figure 5:
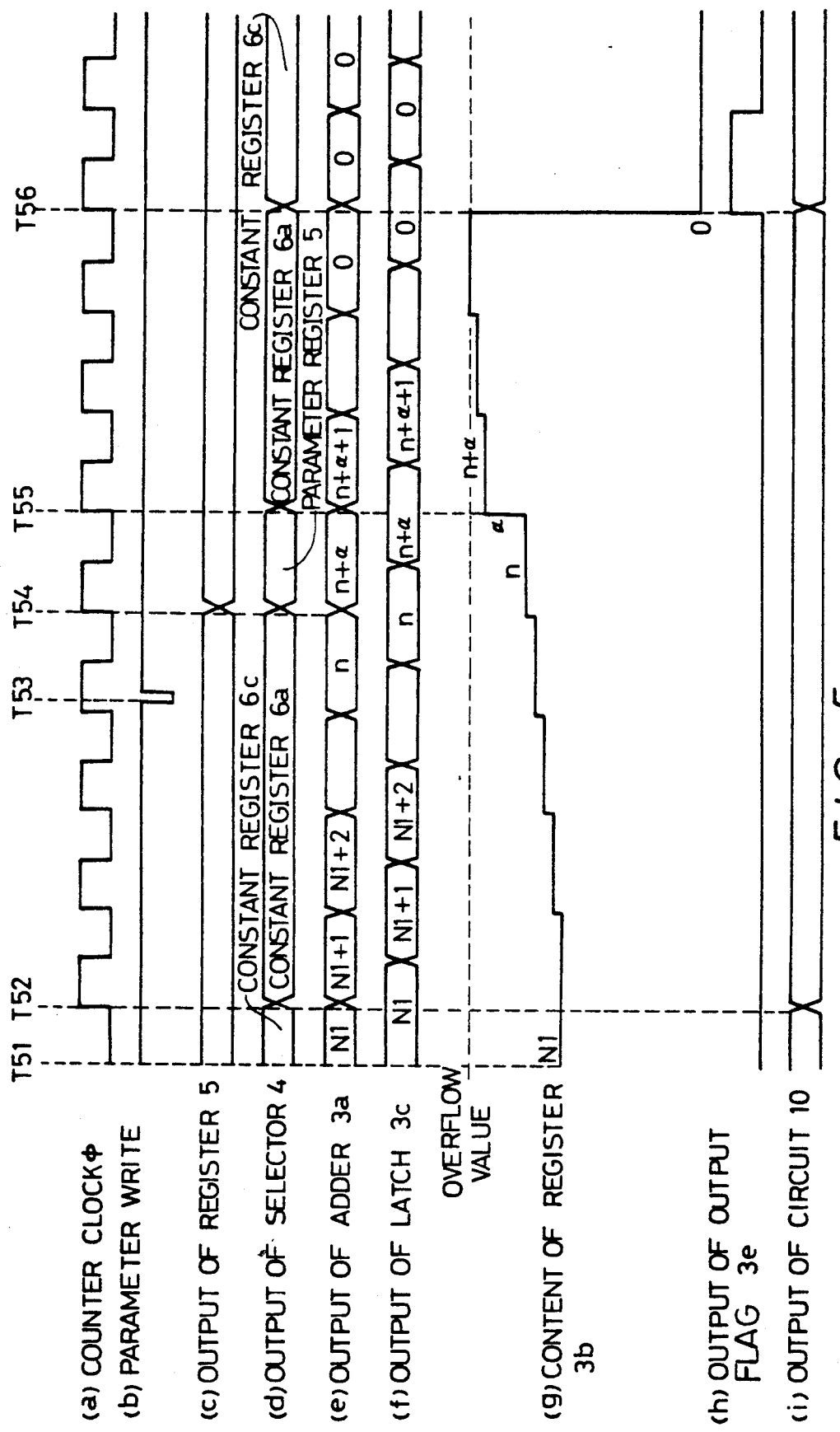
FIGS. 5(a)-5(i) are timing charts for use in explaining the operation of the pulse generator circuit shown in FIG. 4.

In the illustrated embodiment of the present invention, incrementing by "+1" is shown in FIG. 5 to be completed in one cycle of the reference clock signal, but it may be done over a plurality of cycles if times required for performing various steps are substantially same.

As described above in detail, according to the present invention, a counter comprises an adder, and a selector is provided for selecting one of a count-up register, a count-down register, a count-interruption register, and a parameter register which receives desired data to be directly applied to the adder from a CPU. When it becomes necessary to change the pulse width, a value by which correction should be made is set into the parameter register, so that the count value is immediately modified. Accordingly, the width of a pulse can be modified at any time and even during a time when the pulse is being generated, without being affected by a delay which would otherwise caused by software processing.

What is claimed is:

1. A pulse generator circuit comprising:
   an adder operating in synchronization with a clock signal;
   a count register for holding a result of addition provided by said adder and applying the thus held addition-result to said adder as one input for addition;
   carry/borrow detecting means for detecting when a carry/borrow occurs in the addition-result from said adder and developing a carry/borrow signal;
   a shift register responsive to said carry/borrow signal applied thereto;

constant registers for holding constants;

a parameter register for holding a value externally set therein;

a selector for selecting one of said constant and parameter registers for causing a value held in the thus selected register to be applied to said adder as another input to be added to a value applied to said adder from said count register; and means for causing said selector to select said parameter register when a carry/borrow occurs in an addition-result from said adder or when a new value is set in said parameter register, and otherwise to select one of said constant registers.

2. A pulse generator circuit according to claim 1 wherein said constant registers comprises three constant registers respectively holding constants "0", "+1" and "−1"; said adder stops counting when said selector selects the constant register which is holding "0"; said adder performs count-down operation when said selector selects the constant register which is holding "−1"; and said adder performs count-up operation when said selector selects the constant register which is holding "+1".

3. A pulse generator circuit according to claim 1 wherein said means for causing is effective to cause said adder to perform a count-up operation; said carry/borrow detecting means develops and applies a carry/borrow signal to said shift register when the count in said adder overflows; and said shift register shifts contents therein in response to said carry/borrow signal applied thereto to generate an output pulse having a predetermined time width.

4. A pulse generator circuit according to claim 1, wherein said means for causing is effective to cause said adder to perform a count-down operation; said carry/borrow detecting means develops and applies a carry/borrow signal to said shift register when a count in said adder underflows; and said shift register shifts contents therein in response to said carry/borrow signal applied thereto to generate an output pulse having a predetermined time width.

5. A pulse generator circuit according to claim 1, said pulse generator circuit generates an engine fuel injection pulse signal, wherein an output pulse developed at an output of said shift register is used to control an amount of fuel to be injected into an engine; and when it becomes necessary to change an width of said output pulse in response to an abrupt change in an engine output, a correction value corresponding to said abrupt change is written into said parameter register, and said selector selects said parameter register so as to apply said correction value to said adder.

6. A pulse generator circuit comprising;
a counter;
means for permitting insertion of an initial content into said counter;
means for storing an externally supplied parameter and a plurality of constants;
means for cyclically adding a value to said counter in response to a predetermined condition of said counter;
said value including a selectable one of said plurality of constants and said external supplied parameter;
means for beginning an output pulse in response to a first predetermined condition of said content; and
means for ending an output pulse in response to a second predetermined condition of said content.

7. Apparatus according to claim 6, wherein said constant includes one of +1 and −1.

8. Apparatus according to claim 6, wherein said constant includes a selectable one of zero and a non-zero value, whereby, when zero is selected, said content remains unchanged, when said non-zero value is selected, said content changes by said non-zero value, and when said parameter is selected, said content changes by said parameter.

9. Apparatus according to claim 6, wherein said constant includes a selectable one of zero and a positive value, whereby said content increases when said positive value is selected, and said content remains unchanged when said zero is selected.

10. Apparatus according to claim 6, wherein said constant includes a selectable one of zero and a negative value, whereby said content decreases when said negative value is selected, and said content remains unchanged when said zero is selected.

11. A pulse generator circuit comprising:
a counting register having a content;
means for selecting a value from one of an externally supplied parameter and a plurality of constants responsive to an externally generated control signal;
means for cyclically adding said value to said content;
means for cyclically beginning an output pulse in response to a first predetermined condition of said counter; and
means for cyclically ending an output pulse in response to a second predetermined condition of said counter.

12. A pulse generator circuit comprising:
a cyclic counting register having a content and a limit;
means for intializing said register to produce cyclic counting;
means for holding a plurality of constants and a correction value;
means for adding one of said plurality of constants to said content in response to an externally generated control signal;
means for substituting said one of a plurality of constants with a said correction value during at least one cyclic event in response to said externally generated control signal;
means for beginning an output pulse in response to a first predetermined condition of said counter; and
means for ending an output pulse in response pulse to a second predetermined condition of said counter.

13. A pulse generator circuit comprising:
a counting register having a content;
means for selecting a value from one of an externally supplied parameter and a plurality of constants responsive to an externally generated control signal;
said plurality of constants including a +1, −1 and 0.
means for cyclically adding said value to said content;
means for cyclically beginning an output pulse in response pulse to a first predetermined condition of said counter; and
means for cyclically ending an output pulse in response pulse to a second predetermined condition of said counter.

* * * * *